United States Patent [19]

Hasbun

[11] Patent Number: 5,671,388
[45] Date of Patent: Sep. 23, 1997

[54] METHOD AND APPARATUS FOR PERFORMING WRITE OPERATIONS IN MULTI-LEVEL CELL STORAGE DEVICE

[75] Inventor: Robert N. Hasbun, Shingle Springs, Calif.

[73] Assignee: Intel Corporation, Santa Clara, Calif.

[21] Appl. No.: 433,614

[22] Filed: May 3, 1995

[51] Int. Cl.⁶ .................................................. G06F 12/02
[52] U.S. Cl. .......................... 395/430; 395/492; 365/168; 365/185.03
[58] Field of Search ................................ 395/430, 494, 395/492; 365/168, 185.03

[56] References Cited

U.S. PATENT DOCUMENTS

| | | | |
|---|---|---|---|
| 5,287,478 | 2/1994 | Johnston et al. | 395/438 |
| 5,313,585 | 5/1994 | Jeffries et al. | 395/411 |
| 5,450,341 | 9/1995 | Sawada et al. | 365/185.24 |
| 5,475,693 | 12/1995 | Christopherson et al. | 371/10.2 |
| 5,479,633 | 12/1995 | Wells et al. | 395/430 |
| 5,485,422 | 1/1996 | Bauer et al. | 365/168 |

*Primary Examiner*—Eddie P. Chan
*Assistant Examiner*—Reginald G. Bragdon
*Attorney, Agent, or Firm*—Blakely, Sokoloff, Taylor & Zafman

[57] ABSTRACT

A memory contains a plurality of memory cells that are capable of storing one or more bits of data in each memory cell. The memory stores, in response to a write operation, data corresponding to the write operation in a first set of the memory cells such that each cell of the first set of the memory cells stores a single bit. Thereafter, data from the first set of memory cells are transferred to a second set of the memory cells such that each cell of the second set of the memory cells stores more than a single bit of data. The write operation to the first set of cells is executed in a foreground operation, and in a subsequent background operation, data from the first set of memory cells are transferred to the second set of memory cells. The memory cells are non-volatile flash electrically erasable programmable read only memory (EEPROM) cells, and therefore require erasure before programming. Typically, memory cells are reclaimed in a background operation. However, if not enough memory cells are available for a write operation, then a set of memory cells are reclaimed in a foreground operation, and more than one bit of the data are stored in the reclaimed memory cells.

20 Claims, 5 Drawing Sheets

METHOD AND APPARATUS FOR PERFORMING WRITE OPERATIONS IN MULTI-LEVEL CELL STORAGE DEVICE

FIELD OF THE INVENTION

The present invention relates to the field of data storage, and more particularly, to storing data in a memory that is capable of storing one or more bits of data in each memory cell.

BACKGROUND OF THE INVENTION

Semiconductor memory devices consist of a number of individual memory cells to store data. Typically, in a conventional binary memory device, each memory cell is capable of storing two levels or states to represent one bit of data. In order to increase the density of data storage in memory devices, each memory cell may store more than one bit of data. These memory devices are referred to as multi-level or multi-bit memory devices. Multi-level memory devices increase the capacity and density over conventional binary memory devices. For example, a memory device capable of storing two bits of data per cell has a capacity to store twice the data in the same number of cells than a conventional binary memory device.

The programming of conventional binary memory devices consists of storing or programming one of two levels or states in a memory cell to represent one bit of data. For example, a memory cell, when accessed during a write operation, stores a first voltage or threshold level to represent a first state, and stores a second voltage or threshold level to represent the second state. However, in a multi-level memory device, more than two states are stored to represent more than a single bit of data. For example, in order to store two bits in each memory cell, four levels are required.

Typically, programming or writing to programmable memory cells includes a verification operation to determine that a proper state or level has been programmed into the cell. Typically, programming and verification operations are conducted on memory devices constructed of flash electrically erasable programmable read only memory (EEPROM) cells to generate charge on a floating gate. In order to store two bits in a single cell, four discrete levels or states are required. In addition, at least three reference levels are required to discern the four states in the verification operation.

For a flash EEPROM memory cell that stores two bits, no programming is required to represent a first state (e.g. no charge is programmed on the floating gate). A program and verification circuit programs a charge in a selected flash EEPROM cell to represent a second state. The program and verification circuit also reads the second state from the selected memory cell, and compares the second state read to a first reference level. If a third state is desired for the selected memory cell, then additional programming occurs, and the verification process is repeated by comparing the state of the memory cell to a second pre-determined reference level. Similarly, the program and verification circuit executes this process to program the fourth state. Although the above example illustrates programming of a flash EEPROM cell, regardless of the cell technology, such an iterative process is slower for a multi-level memory cell than for the single bit memory cell. It is desirable to increase the speed of programming a multi-level memory device.

In general, disk drives are utilized in computer systems as mass storage devices. Typically, these mass storage devices store files, including control information and data, for the computer system. As discussed above, multi-level memory devices increase storage density over conventional binary memory systems, and therefore have application for use as mass storage devices in computer systems.

In order to provide optimal performance for the computer system, solid state disk drives require the ability to read and write data in an expeditious manner. As illustrated in the above multi-level programming example, programming the multiple levels in the multi-level memory device inherently results in slower write operations than with conventional binary memory devices. Therefore, it is desirable to execute fast write operations in solid state disk drives that are capable of storing one or more bits per cell.

SUMMARY OF THE INVENTION

A memory contains a plurality of memory cells that are capable of storing one or more bits of data in each memory cell. The memory stores, in response to a write operation, data corresponding to the write operation in a first set of the memory cells such that each cell of the first set of the memory cells stores a single bit. Thereafter, data from the first set of memory cells are transferred to a second set of the memory cells such that each cell of the second set of the memory cells stores more than a single bit of data.

Both foreground and background operations are performed on the memory. For example, a write operation is executed as a foreground operation if the write operation is performed directly after receiving a write request. A background operation occurs when the system is not servicing an access request. In one embodiment, the write operation to the first set of memory cells is executed in a foreground operation. In a subsequent background operation, when no access request to the memory occurs, the data from the first set of memory cells are transferred to the second set of memory cells. Because writing more than one bit per cell to the memory takes longer than writing only a single bit per cell, the initial write to the first set of memory cells results in a more expeditious write operation.

In one embodiment, the memory cells are non-volatile flash electrically erasable programmable read only memory (EEPROM) cells, and require erasure before programming. For this embodiment, memory cells are reclaimed when a particular group, such as a block, contains a sufficient quantity of cells storing invalid data.

After receiving a request for a write operation, control circuitry determines whether the memory contains available memory cells for use as the first set of the memory cells. If not enough memory cells are available, then a set of memory cells are reclaimed in a foreground operation, and more than one bit of data are stored in the reclaimed memory cells.

Other features and advantages of the present invention will be apparent from the accompanying drawings, and from the detailed description that follows below.

BRIEF DESCRIPTION OF THE DRAWINGS

The features and advantages of the present invention will be apparent from the following detailed description with references to the following drawings.

DETAILED DESCRIPTION

Figure 1:
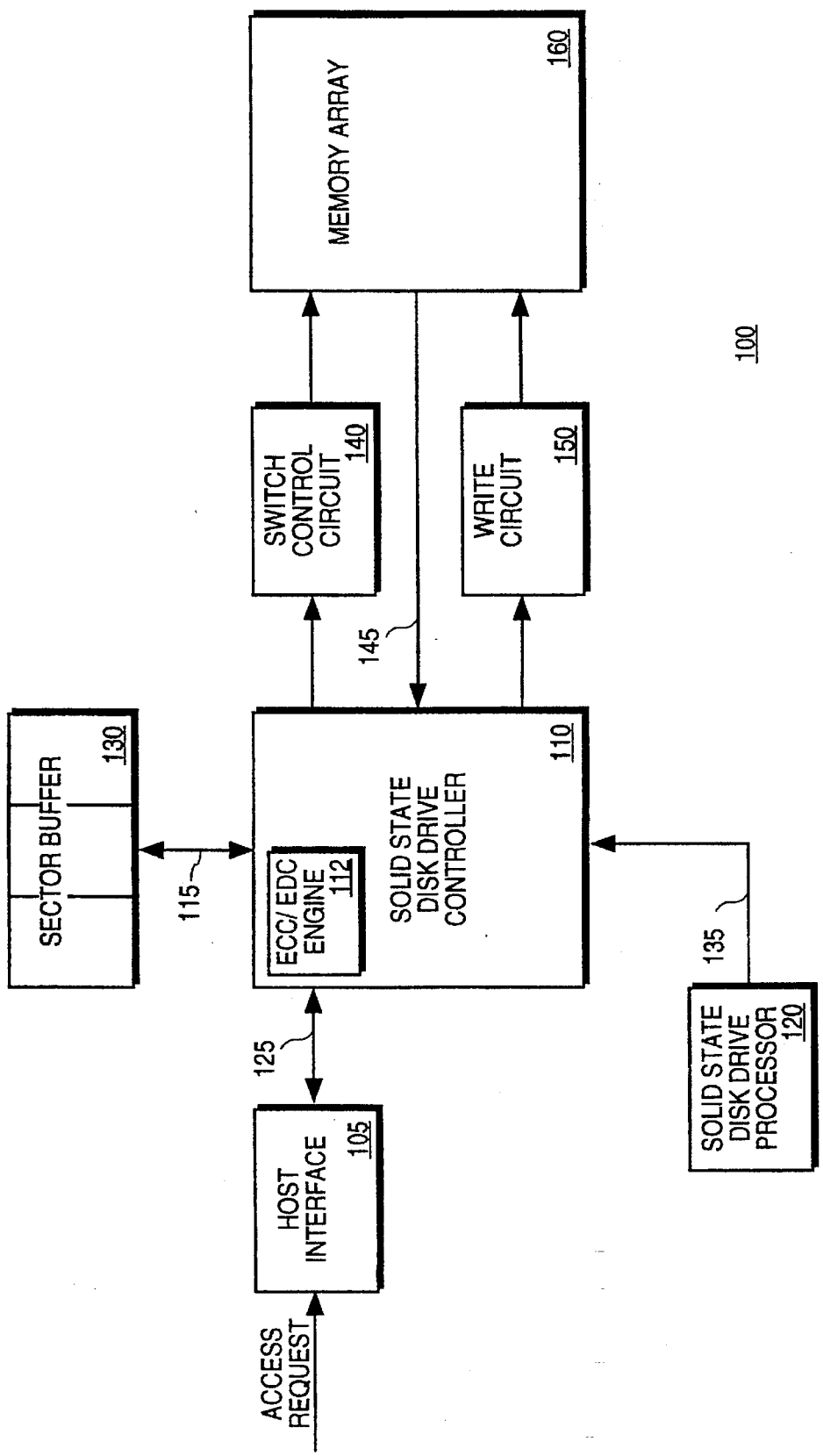
FIG. 1 illustrates one embodiment for a solid state disk drive configured in accordance with the present invention.

FIG. 1 illustrates one embodiment for a solid state disk drive configured in accordance with the present invention. A solid state disk drive 100 contains a memory array 160. The memory array 160 includes a plurality of memory cells, wherein each memory cell is capable of storing one or more bits. In a preferred embodiment, the memory array 160 is configured in an array having a plurality of rows and columns. However, no specific arrangement of memory cells is required to practice the present invention. The solid state disk drive 100 operates in either a single level cell (SLC) mode or a multi-level cell (MLC) mode. In the single level cell mode, the memory array 160 stores one bit per memory cell. When operating in the multi-level cell mode, the memory array 160 stores more than one bit per cell.

The solid state disk drive 100 contains a host interface 105 to interface the solid state disk drive 100 to a host (not shown). In general, a host is defined as a system or subsystem that stores information in the solid state disk drive 100. A general purpose computer system utilizing the solid state disk drive 100 is described below. The host interface 105 may be configured in accordance with any interface standard or specification. For example, the host interface 105 may be configured in accordance with an AT bus attachment (ATA) specification, or a Personal Computer Memory Card International Association (PCMCIA) standard. In accordance with the interface standard being implemented, host interface 105 receives access requests from the host (e.g. read and write operations). The operation of a host interface, such as host interface 105, that is configured in accordance with the ATA or PCMCIA standards is well known in the art and will not be described further.

In one embodiment, the solid state disk drive 100 further includes a solid state disk drive processor 120, solid state disk drive controller 110, and sector buffer 130. In general, the solid state disk drive processor 120 provides intelligence and control for the memory array 160. For example, the solid state disk drive processor 120 controls foreground and background operations in accordance with write operations of the present invention.

The solid state disk drive controller 110 is coupled to the sector buffer 130 via an interface 115, to the host interface 105 via an interface 125, to memory array via interface 145, and to the solid state disk drive processor 120 via an interface 135. In a preferred embodiment, the interfaces 145, 125, and 135 operate asynchronously. In general, the solid state disk drive controller 110 provides the necessary logic to both interface and arbitrate between the host interface 105, the memory array interface 145, and solid state disk drive processor 120 to the sector buffer 130.

In one embodiment, the solid state disk drive 100 contains an error detection and correction (EDC) engine 112 to provide error correction and detection (EDC) for data stored in the memory array 160. The operation for one embodiment of the solid state disk drive controller 110 is described more fully below. The sector buffer 130 stores data, transferred from the host interface 105 via the solid state disk drive controller 110 during a write operation, prior to transfer to the memory array 160. During a read operation, the sector buffer 130 temporarily stores data from memory array 160 via controller 110 prior to transfer to the host interface 105. In a preferred embodiment, the sector buffer 130 is a random access memory (RAM), and is capable of storing three sectors of data.

As shown in FIG. 1, the solid state disk drive controller 110 is further coupled to a switch control circuit 140, a write circuit 150, and the memory array 160. The switch control 140 receives an indication from the solid state disk drive controller 110 to switch the mode of operation between the multi-level cell mode and the single level cell mode. For a complete description of one embodiment for the switch control circuit 140, see U.S. patent application, entitled "A Dynamic Single Bit Per Cell To Multiple Bit Per Cell Memory", Ser. No. 08/252,686, filed Jun. 2, 1994, inventors Bauer et al., and assigned to the assignee of the present invention, Intel® Corporation, Santa Clara, Calif.

The write circuit 150 receives an indication from the solid state disk drive controller 110 to write data in either the MLC mode or the SLC mode. The write circuit 150 contains program circuitry to program the memory array 160. The write circuit 150 is intended to represent a broad category of circuits for programming memory cells, such as flash EEPROM cells, which are well known in the art and will not be described further.

The present invention has application for use in a memory system capable of storing more than a single bit of information in each cell. In one embodiment, the cells of the memory device are constructed as flash electrically erasable programmable read only memory (flash EEPROM) cells. Although the present invention is described in conjunction with flash EEPROM cells, other cells, such as, but not exclusively, erasable programmable read only memory (EPROM), conventional electrical erasable programmable read only memory (EEPROM), dynamic random access memory (DRAM), or static random access memory (SRAM) may be substituted without deviating from the spirit and scope of the invention.

The memory array 160 is organized in blocks of EEPROM cells, wherein a particular block can be programmed and erased simultaneously. The flash EEPROM devices are non-volatile memory devices such that once programmed by a user, the EEPROM cells retain the state programmed until erased. In one embodiment, the flash EEPROM cells consist of a single transistor having a select gate, a floating gate, a source, and a drain. The source and drain reside on the substrate, and the substrate is grounded. The floating gate is insulated from the select gate and the channel region of the cell by a non-conductive oxide to permit retention of charge on the floating gate.

The flash EEPROM memory cell is turned on and off by the absence or presence of charge on the floating gate. During programming, the electrons are placed on the floating gate, and are trapped by surrounding non-conductive oxide. If electrons reside on the floating gate, the field effect generated by the excess electrons results in a high threshold of conductivity for the memory cell. When a voltage is applied to the select gate of such a memory cell, the memory cell is turned off, thereby storing a first logic state. When no excess electrons are trapped on the floating gate, however, the memory cell exhibits a lower threshold of conduction, and the memory cell conducts current to represent a different logic state.

The floating gate can retain a range of charges, and therefore the memory cell can be programmed to exhibit multiple thresholds of conduction or multiple threshold levels. By storing multiple threshold levels on the floating gate of the cell, the memory cell may be programmed to store more than a single bit. In order to discern the multiple threshold levels, the memory system designates threshold windows. Each threshold window specifies a memory state of the cell. The multiple threshold levels demarcate $2^n$ number of windows for designating states to represent storage of "n" bits of data for the memory cells. The present invention is described in conjunction with a memory cell capable of storing four states to represent two bits. However, the present invention applies to a memory cells storing three or more states.

In a preferred embodiment, the solid state disk drive 100 is divided into blocks. Each block contains several sectors consisting of an arbitrary length of data. For the solid state disk drive application, the memory array 160 is apportioned into 512 byte sectors. In a preferred embodiment, the memory array 160 contains a plurality of flash EEPROM integrated circuit chips. Each flash EEPROM integrated circuit chip contains 32 blocks. The blocks are arranged in flash EEPROM chip pairs, such that one block integrates the use of two flash EEPROM integrated circuit chips in an odd and even chip pair arrangement.

Figure 2:
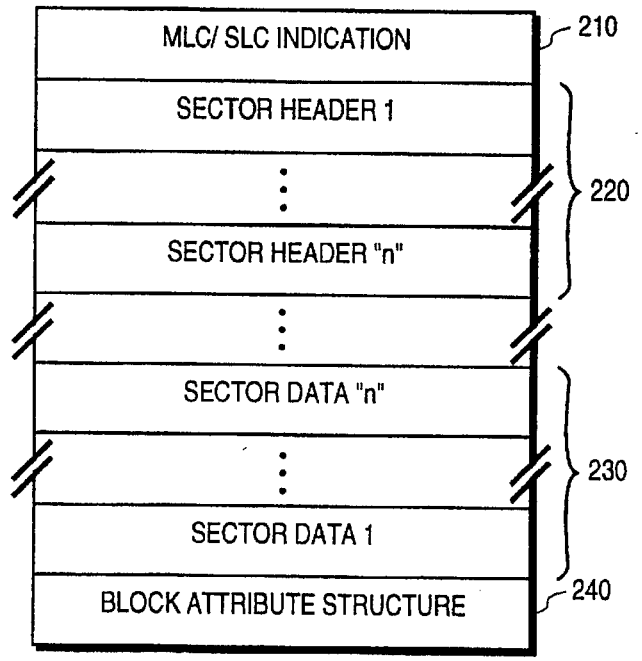
FIG. 2 illustrates a format for a block configured in accordance with one embodiment of the present invention.

In order to support a file structure for the solid state disk drive 100, each block contains control information and data. FIG. 2 illustrates a format 200 for a block stored in the memory array 160 configured in accordance with one embodiment of the present invention. As is the arrangement for typical hard disk drives in computer systems, the blocks are arranged in sectors (e.g. one sector contains 512 bytes). As shown in FIG. 2, the format for the block contains a multi-level cell and a single level cell (MLC/SLC) field 210. The MLC/SLC field 210 specifies whether the block is formatted to store files in the multi-level cell mode or the single level cell mode.

The block format 200 contains a sector header field 220 for each sector, labeled (1–n) on FIG. 2, to store control and file attribute information for each corresponding sector. Also for each sector, sector data are stored as shown in the area labeled 230 on FIG. 2 for "n" sectors. The block format 200 further includes a block attribute structure 240. The block attribute structure 240 stores information pertaining to block operations, such as a clean-up operation. For example, in one embodiment, the block attribute structure 240 stores cycle count, whether the particular block is formatted or not, and information used for the clean-up operation. As shown in the block format 200 of FIG. 2, as sectors are generated, sector headers 220 are written from the top down, and sector data 230 are written from the bottom up.

In a preferred embodiment, the MLC/SLC indication field 210, sector headers 220, and file attribute structure 240 are written in the SLC mode. If the block contains MLC data, sector data 230 are written to the memory array 160 such that each memory cell stores more than one bit. Alternatively, if data for a particular block are written in the single level cell mode, then sector data 330 are written to the memory array 160 such that each memory cell stores one bit. Although the present invention is described in conjunction with a block format that stores either single level cell data or multi-level cell data for each block, a block format that mixes between single level cell and multi-level cell data may be used without deviating from the spirit and scope of the invention.

Figure 3:
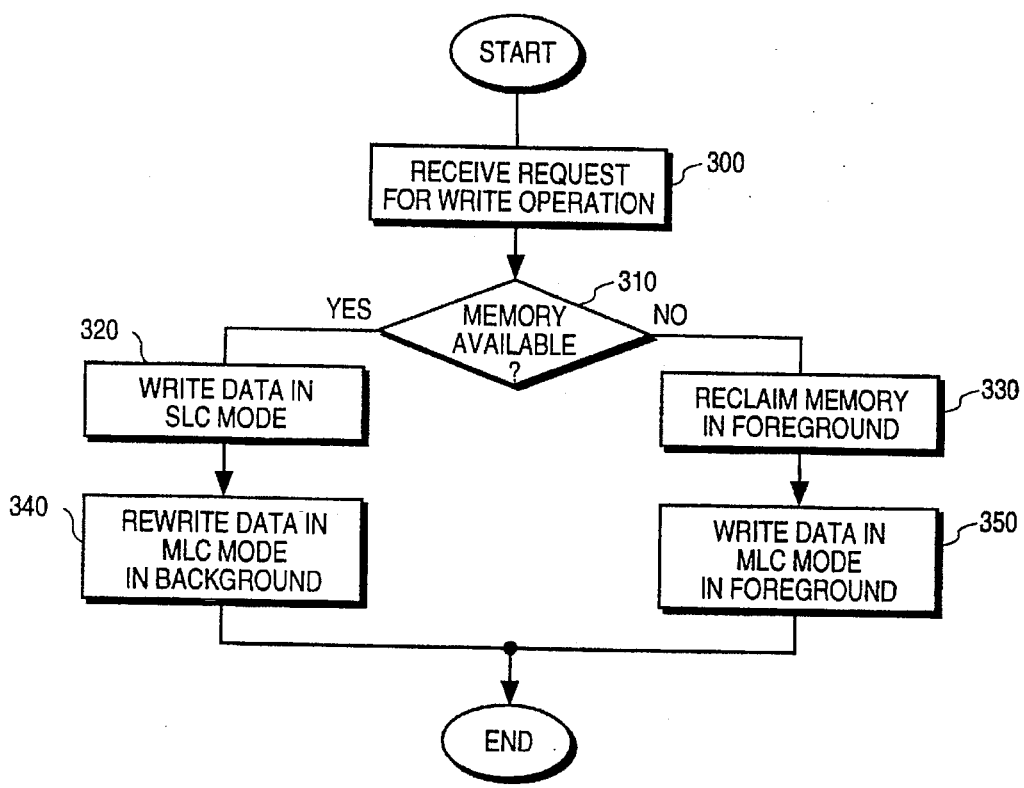
FIG. 3 is a flow diagram illustrating one embodiment of a high level write operation of the present invention.

FIG. 3 is a flow diagram illustrating one embodiment of a high level write operation configured in accordance with the present invention. The write operation illustrated in FIG. 3 is described in conjunction with the solid state disk drive 100 shown in FIG. 1. The write operation is initiated when the solid state disk drive 100 receives a request for a write operation from a host as shown in block 300. The solid state disk drive 100 determines whether enough memory is currently available to accommodate the write operation as shown in decision block 310. If the memory array 160 contains enough memory for the write operation, then data are written to the memory array 160 in the single level cell mode (e.g. one bit per cell) as shown in block 320. Alternatively, if the memory array 160 does not contain enough memory to accommodate the write operation, then the solid state disk drive 100 executes a redamarion operation in the foreground as shown in block 330.

In general, the reclamation operation reclaims memory space in the solid state disk drive 100 to store new data. One embodiment for a reclamation operation is described more fully below. During the foreground reclamation operation, the host is suspended from transferring data such that data are not transferred into the memory array 160. After completion of the reclamation operation, data are written to the memory in the MLC mode as shown in block 350. If data was written in the SLC mode during a foreground operation, then the solid state disk drive 100, in a subsequent background reclamation operation, rewrites data to a different portion of memory in the MLC mode as shown in block 340.

Figure 4:
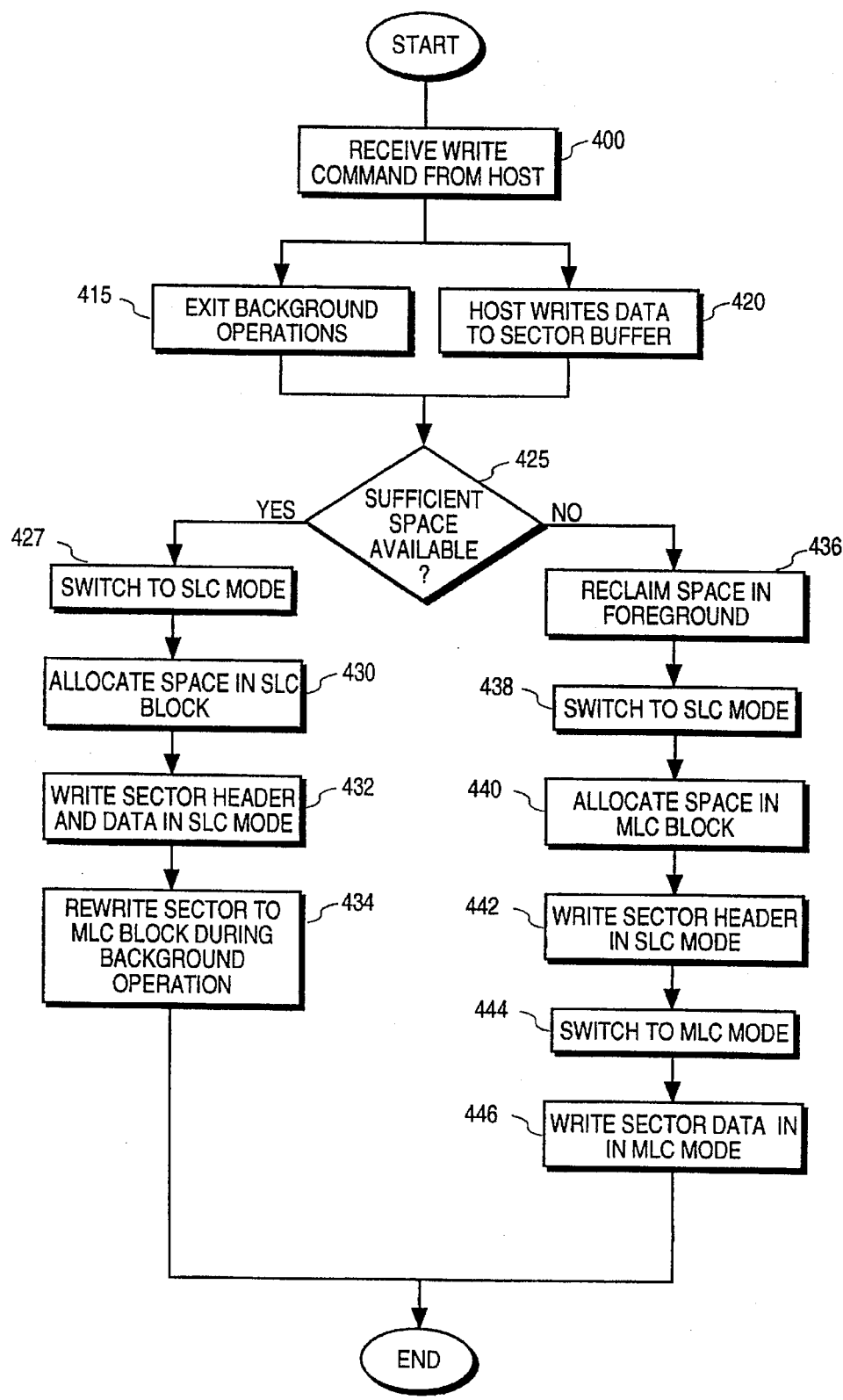
FIG. 4 is a flow diagram illustrating one embodiment for the write operation of the present invention.

FIG. 4 is a flow diagram illustrating one embodiment for the write operation of the present invention. The write operation illustrated in FIG. 4 is also described in conjunction with the solid state disk drive 100 shown in FIG. 1. The write operation is initiated by the host issuing a write command to the host interface 105 as shown in block 400. In accordance with the ATA command specification, the command includes a starting sector and sector count for the write operation. Also, in accordance with the ATA specification, the solid state disk drive controller 110 issues a data request, via the host interface 105, to the host. The solid state disk drive controller 110 interrupts the solid state disk drive processor 120 to inform the processor 120 of the write operation.

In response to the write command, the solid state disk drive processor 120 exits any background operation currently underway as shown in block 415. Specifically, the solid state disk drive processor 120 cleans-up the current background operation by saving the state of the operation (e.g. saving pointers to memory locations and state information). The data request issued indicates to the host whether space is available in the sector buffer 130. The host writes data corresponding to the write operation to the sector buffer 130 through the host interface 105 and solid state disk drive controller 110 as shown in block 420. The sector buffer 130 write is concurrent with the exit background operation.

The solid state disk drive processor 120 determines whether sufficient area on the memory array 160 exists to allocate for the write operation as shown in derision block 425. In one embodiment, the solid state disk drive processor 120 maintains, in a local random access memory (RAM), information identifying available memory space in the memory array 160. The processor 120 also maintains information to identify blocks that are free and usable within the memory array 160. If the solid state disk drive processor 120 determines that space is available for the write operation, then the memory array 160 is switched for operation in the MLC mode as shown in block 427. As shown in block 430, space is allocated for the write operation in a SLC block. Sector header information for the allocated SLC block are written to the block in the sector header portion 220 (FIG. 2) in SLC mode.

Data, corresponding to the write operation, are written in the SLC mode from the sector buffer 130 to the allocated SLC blocks in the memory array 160 as shown in block 432. In this way, each sector is transferred from the host interface 105 to the sector buffer 130, and subsequently transferred from the sector buffer 130 to the allocated SLC block in the memory array 160 by utilizing word byte programming. If the solid state disk drive 100 incorporates error detection and correction, then the ECC/EDC engine 112 generates an error correctional code (ECC) for the data being written to the memory array 160. In one embodiment, the ECC bytes are written at either the end of the host write or at the end of each sector.

When all data has been written to the memory array 160, the solid state disk drive processor 120 may resume background operation. The solid state disk drive processor 120 performs background write operations in the MLC mode. The background write operation includes allocating one or more MLC blocks in the memory array 160. During reclamation, the solid state disk drive processor 120 rewrites data written as SLC data to the allocated blocks for MLC data as shown in block 434 on FIG. 4.

If the solid state disk drive processor 120 determines that no space is available in SLC blocks to write the data, then the processor 120 executes a reclamation operation as a foreground operation as shown in blocks 425 and 436 in FIG. 4. The reclamation operation generates clean and usable blocks for allocation to the pending write operation. The solid state disk drive processor 120 switches, via the solid state disk drive controller 110 and switch control circuit 140, to the SLC mode as shown in block 438. As shown in block 440, space is allocated for the write operation in one or more MLC blocks. The sector header information for the allocated MLC block is written in the sector header portion 220 (FIG. 2) in SLC mode as shown in block 442. The solid state disk drive processor 120 switches, via the solid state disk drive controller 110 and switch control circuit 140, to the MLC mode from the SLC mode as shown in block 444. The solid state disk drive processor 120 resumes the write operation by transferring data from the sector buffer 130 to the memory array 160 via the solid state disk drive controller 110. Under this condition, data are written in the MLC mode as shown in block 446.

If the write operation of the present invention utilizes non-volatile memory, the memory cells require erasure prior to writing or programming new data. The sector header structure 220 (FIG. 2) contains information to indicate whether a sector is dirty. If a sector is marked dirty, the information contained within the particular sector is no longer valid. As a background operation, the solid state disk drive processor 120 determines the number of dirty sectors in a block to determine whether that block is a good candidate for reclamation. In one embodiment, the solid state disk drive processor 120 marks blocks that contain at least 50% dirty sectors as a candidate for block reclamation. In the embodiment that stores data in blocks in either MLC or SLC modes, if a SLC block and a MLC block are equally as dirty, then the SLC block is reclaimed first. In deciding between a SLC block or a MLC block for a reclamation operation, the SLC sectors are weighted two times the MLC sectors.

In order to execute a reclamation operation, the solid state disk drive processor 120 saves all valid sectors in a block to be erased by copying the sectors into another block. If the block being reclaimed stores data in the SLC mode, then data are copied into the block in the MLC mode. The block being reclaimed then undergoes an erase operation. For the solid state disk drive containing flash EEPROM cells, the erase operation includes a Fowler-Nordeim tunneling operation. The erase operation further includes verifying that the cells have all been properly erased. A verified erased block is ready for allocation as a new block.

Figure 5:
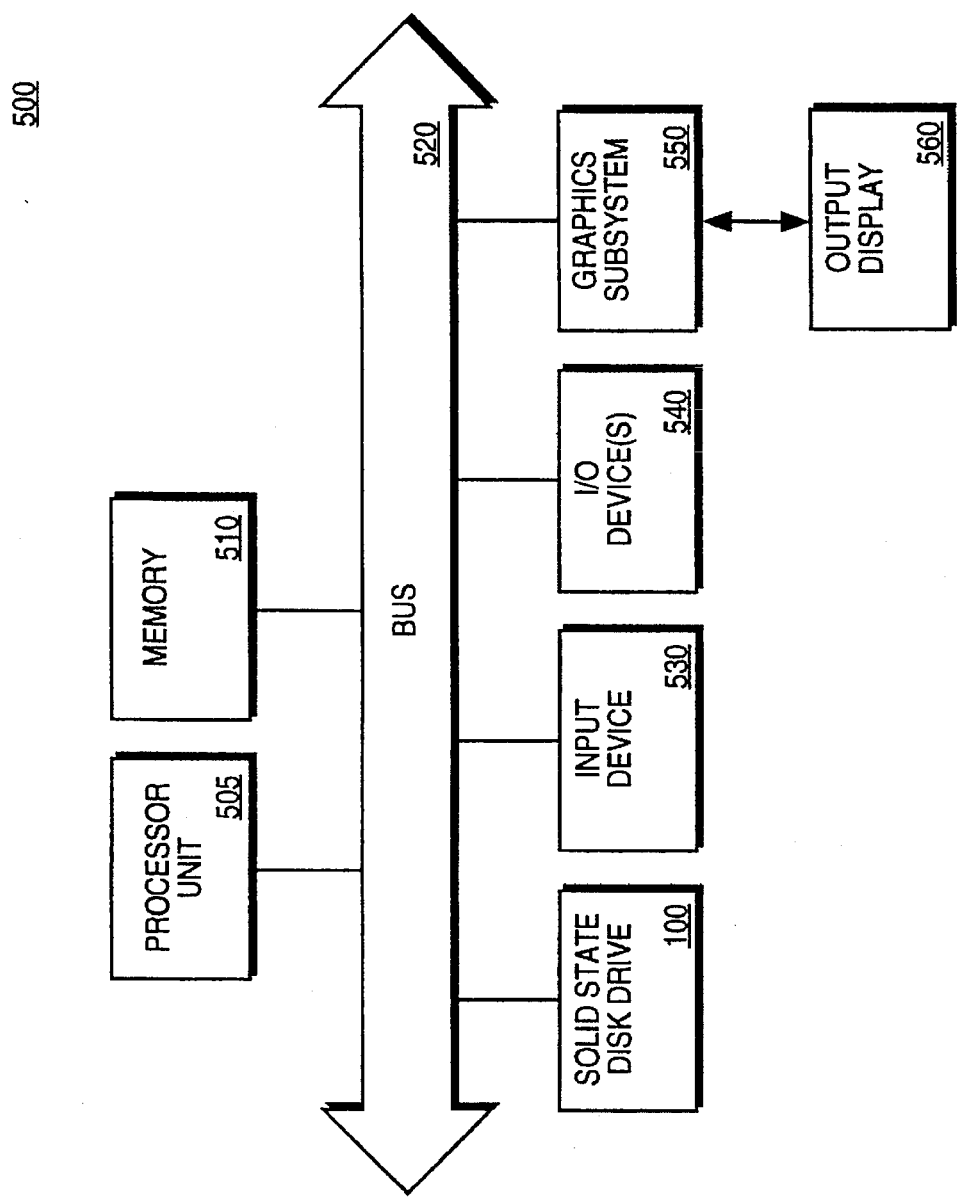
FIG. 5 illustrates a general purpose computer system for which the present invention may be implemented.

FIG. 5 illustrates a general purpose computer system for which the present invention may be implemented. A computer system 500 contains a processor unit 505 and main memory 510. The processor unit 505 may contain one or more microprocessors, such as a processor constructed in accordance with the Intel® microprocessor architecture. The computer system 500 further includes an input device 530, for receiving control input from a user, and a plurality of input/output "I/O" devices 540. The computer system 500 also contains a graphic subsystem 550 coupled to an output display 560 to generate graphics for the computer system 500.

As shown in FIG. 5, the computer components are coupled via a bus 520. However, these components may be coupled through one or more busses. For example, the processor unit 505 and main memory 510 may be coupled via a microprocessor bus, and the peripheral devices may be coupled via an industry standard association (ISA) bus or an extended industry standard association (EISA) bus, or a peripheral component interconnect (PCI) bus. The processor unit 505, main memory 510, bus 520, input device 530, I/O devices 540, graphic subsystem 550, and output display 560 are those devices that are typically found on a computer system, and are intended to represent a broad category of such devices which are well known in the art and will not be described further.

The computer system 500 further includes the solid state disk drive 100. The solid state disk drive 100, operating in accordance with the present invention, permits a host, such as the processor unit 505, to write to a high density storage medium with minimal access time. Because most write operations are first executed in the solid state disk drive 100 using the single level cell (SLC) mode, the solid state disk drive 100 provides a mass storage device for the computer system 500 having the advantage of both a high density storage unit that does not increase delay times for host writes.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A method for storing data in a memory comprising a plurality of cells capable of storing more than a single bit of data per cell, comprising the steps of:

storing data in a first set of said memory cells in accordance with a write operation to said memory,, wherein each cell of said first set of said memory cells stores a single bit of said data; and storing said data from said first set of said memory cells in a second set of said memory cells, wherein each cell of said second set of said memory cells stores more than one bit of said data.

2. The method as set forth in claim 1, wherein:

the step of storing data in said first set of said memory cells comprises the step of storing said data in said first set of said memory cells in a foreground operation; and the step of storing data in said second set of said memory cells comprises the step of storing said data in said second set of said memory cells in a background operation such that said background operation is executed when no accesses to said memory occurs.

3. The method as set forth in claim 1, further comprising the steps of:

determining whether said memory comprises available memory cells for use as said first set of said memory cells to store said data corresponding to said write operation;

reclaiming, as a foreground operation, a third set of memory cells in said memory prior to storing said data if said memory does not comprise enough available memory cells to store said data; and storing, as a foreground operation, said data corresponding to said write operation in said third set of memory cells such that each cell of said third set of said memory cells stores more than a single bit of said data.

4. The method as set forth in claim 1, further comprising the steps of:

determining which memory cells are suitable to reclaim for re-use in a background operation; and reclaiming, as a background operation, memory cells in said memory for re-use.

5. The method as set forth in claim 1, wherein the steps of storing data in said first and second sets of memory comprises the step of storing file data including control information and data.

6. The method as set forth in claim 5, wherein the step of storing file data comprises the step of storing an error correction code (ECC) with said file data.

7. The method as set forth in claim 1, wherein each set of said memory cells comprises blocks for storing a plurality of sectors, said memory cells in each block being erasable simultaneously.

8. The method as set forth in claim 1, wherein said memory cells comprise flash electrically erasable programmable read only memory (EEPROM) cells.

9. The method as set forth in claim 1, wherein the step of storing in a second set of said memory cells said data such that each cell of said second set of said memory cells stores more than a single bit of said data comprises the step of storing two bits of data in each of said second set of said memory cells.

10. A circuit for storing data comprising:

a plurality of memory cells capable of storing more than one bit per cell; and a write circuit, wherein the write circuit stores data in a first set of said memory cells in accordance with a write operation, wherein each cell of said first set of said memory cells stores one bit of said data, wherein the write circuit subsequently stores said data from said first set of said memory cells in a second set of said memory cells, wherein each cell of said second set of said memory cells stores more than one bit of said data.

11. The circuit as set forth in claim 10, wherein said write circuit comprises:

a foreground mode of operation for storing data in said first set of said memory cells; and a background mode of operation for storing said data in said second set of said memory cells such that said background operation is executed when no accesses to said memory occurs.

12. The circuit as set forth in claim 10, further comprising:

a controller circuit for determining whether said memory comprises available memory cells for use as said first set of said memory cells to store said data corresponding to said write operation, for reclaiming, as a foreground operation, a third set of memory cells in said memory prior to storing said data if said memory does not comprise enough available memory cells to store said data; and said write circuit for storing, as a foreground operation, said data corresponding to said write operation in said third set of memory cells such that each cell of said third set of said memory cells stores more than a single bit of said data.

13. The circuit as set forth in claim 10, further comprising a controller circuit for determining which memory cells are suitable to reclaim for re-use in a background operation, and for reclaiming, as a background operation, memory cells in said memory for re-use.

14. The circuit as set forth in claim 10, wherein said data comprises file data including control information and data.

15. The circuit as set forth in claim 14, wherein the step of storing file data comprises the step of storing an error correction code (ECC) with said data file.

16. The circuit as set forth in claim 10, wherein each set of said memory cells comprise blocks for storing a plurality of sectors, said memory cells in each block being erasable simultaneously.

17. The circuit as set forth in claim 10, wherein said memory cells comprise flash electrically erasable programmable read only memory (EEPROM) cells.

18. The circuit as set forth in claim 10, wherein said write circuit stores two bits of data in each of said second set of said memory cells.

19. A computer system, comprising:

a central processing unit (CPU);

memory coupled to said CPU; and a solid state disk drive coupled to said CPU, said solid state disk drive comprising:

a plurality of memory cells capable of storing more than one bit per cell; and a write circuit, wherein the write circuit stores data in a first set of said memory cells in accordance with a write operation, wherein each cell of said first set of said memory cells stores one bit of said data, wherein the write circuit subsequently stores said data from said first set of said memory cells in a second set of said memory cells, wherein each cell of said second set of said memory cells stores more than one bit of said data.

20. The computer system as set forth in claim 19, wherein said write circuit comprises:

a foreground mode of operation for storing data in said first set of said memory cells; and a background mode of operation for storing said data in said second set of said memory cells such that said background operation is executed when no accesses to said memory occurs.

* * * * *

UNITED STATES PATENT AND TRADEMARK OFFICE
CERTIFICATE OF CORRECTION

| | | |
|---|---|---|
| PATENT NO. | : | 5,671,388 |
| DATED | : | September 23, 1997 |
| INVENTOR(S) | : | Robert N. Hasbun |

It is certified that error appears in the above-identified patent and that said Letters Patent is hereby corrected as shown below:

In column 5 at line 53 delete "330" and insert --230--

In column 6 at line 10 delete "redamarion" and insert --reclamation--

In column 6 at line 53 delete "derision" and insert --decision--

In column 10 at line 20 delete "drcuit" and insert --circuit--

Signed and Sealed this

Sixth Day of January, 1998

*Attest:*

BRUCE LEHMAN

*Attesting Officer*

*Commissioner of Patents and Trademarks*